(12) United States Patent
Tan et al.

(10) Patent No.: US 10,497,767 B2
(45) Date of Patent: Dec. 3, 2019

(54) LOW-VISIBILITY DISPLAY SENSING

(71) Applicant: Apple Inc., Cupertino, CA (US)

(72) Inventors: Junhua Tan, Santa Clara, CA (US);
Sun-Il Chang, San Jose, CA (US);
Sebastian Knitter, San Francisco, CA (US); Jie Won Ryu, Sunnyvale, CA (US); Hyunwoo Nho, Stanford, CA (US); Lu Zhang, Cupertino, CA (US);
Nicolas P. Bonnier, Campbell, CA (US); Hung Sheng Lin, San Jose, CA (US); Rui Zhang, Santa Clara, CA (US)

(73) Assignee: APPLE INC., Cupertino, CA (US)

( * ) Notice: Subject to any disclaimer, the term of this patent is extended or adjusted under 35 U.S.C. 154(b) by 48 days.

(21) Appl. No.: 15/698,192

(22) Filed: Sep. 7, 2017

(65) Prior Publication Data

US 2018/0082633 A1 Mar. 22, 2018

Related U.S. Application Data

(60) Provisional application No. 62/396,659, filed on Sep. 19, 2016.

(51) Int. Cl.
*G09G 3/20* (2006.01)
*H01L 27/32* (2006.01)

(52) U.S. Cl.
CPC ........ *H01L 27/3269* (2013.01); *G09G 3/20* (2013.01); *G09G 2310/0202* (2013.01); *G09G 2360/141* (2013.01); *G09G 2360/144* (2013.01); *G09G 2360/145* (2013.01)

(58) Field of Classification Search
CPC ...... G06F 3/01–017; G06F 3/041–047; G09G 2320/029–0295; G09G 2360/14–148; H01L 27/3269
See application file for complete search history.

(56) References Cited

U.S. PATENT DOCUMENTS

| 2010/0090996 A1* | 4/2010 | Chou | G02F 1/13338 |
| | | | 345/207 |
| 2015/0261295 A1* | 9/2015 | Lee | G06F 3/013 |
| | | | 345/157 |
| 2018/0075798 A1* | 3/2018 | Nho | G09G 3/32 |
| 2018/0336823 A1* | 11/2018 | Lin | G09G 3/3233 |

* cited by examiner

*Primary Examiner* — Gene W Lee
(74) *Attorney, Agent, or Firm* — Fletcher Yoder P.C.

(57) ABSTRACT

Electronic devices, storage medium containing instructions, and methods pertain to scanning a display during a sensing phase for the display. One or more parameters pertaining to operation or conditions around the display are obtained. Using the obtained one or more parameters, scanning mode parameters used for sensing are set based at least in part on the obtained one or more parameters. Using the scanning mode parameters, the display is scanned during a sensing phase of the display while reducing the likelihood of visible artifacts.

16 Claims, 10 Drawing Sheets

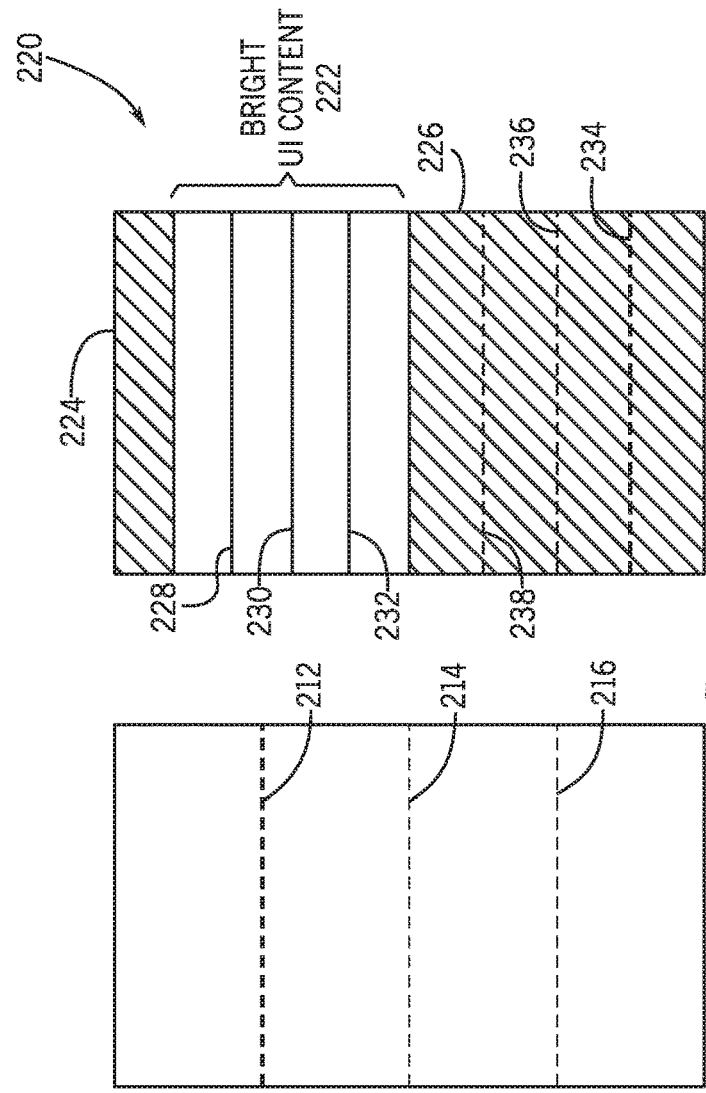

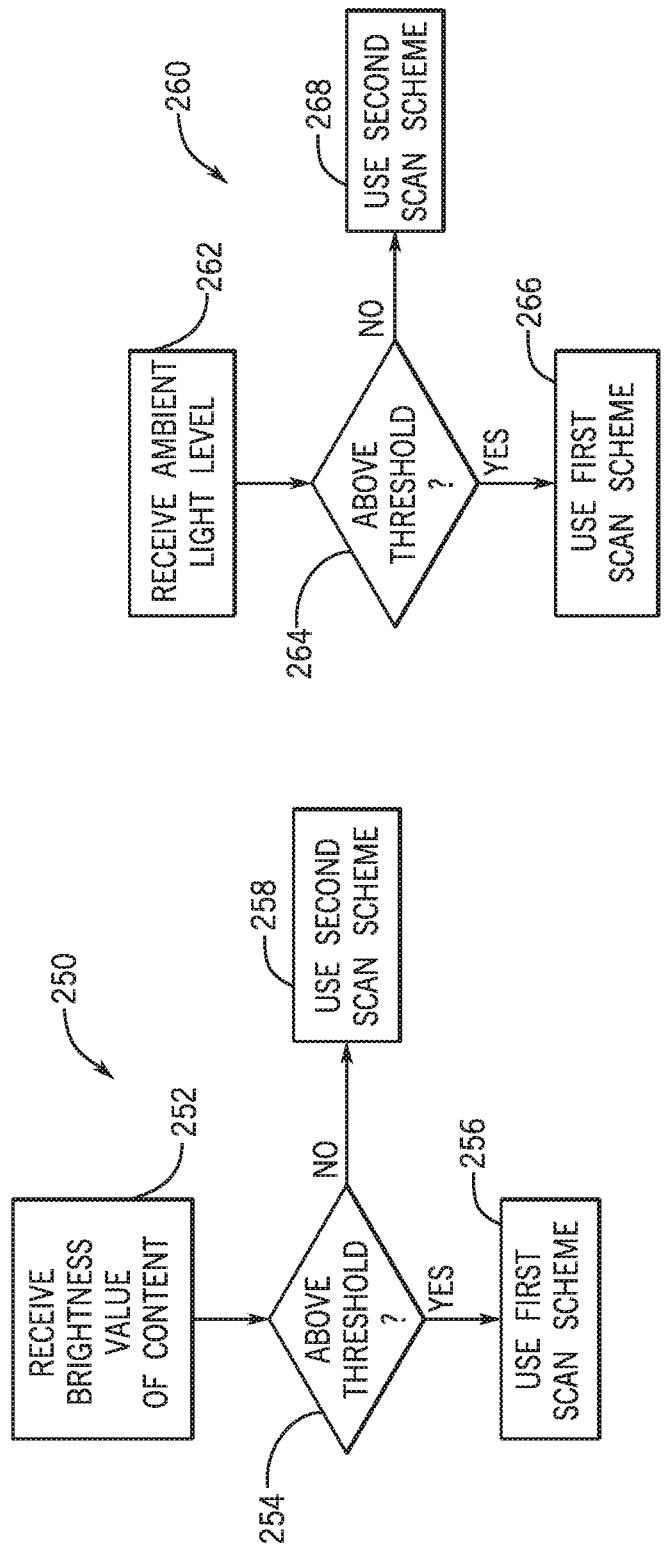

LOW-VISIBILITY DISPLAY SENSING

CROSS REFERENCE TO RELATED APPLICATIONS

This application claims the benefit of U.S. Provisional Application No. 62/396,659, filed on Sep. 19, 2016, the contents of which are herein expressly incorporated by reference for all purposes.

BACKGROUND

The present disclosure relates generally to techniques for low visibility sensing of characteristics of a display.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Sensing of display panel characteristics has wide application, such as integrated touch, embedded sensor, and uniformity compensation. For example, sensing may be used to determine whether pixels are functioning as intended and to determine whether a screen is receiving a touch input. Sensing involves sending data to pixels at power levels lower than used for active emission. However, these data signals used in sensing of a self-emissive panel sometimes causes emission of pixels being sensed that may be visible in addition to or in place of image data. This emission can cause a display to display visual artifacts, such as a sparking noise or bright line, and these artifacts can be substantially detrimental to user experience for a user using the display.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

As previously discussed, a sensing scan of a panel may result in visual artifacts due to the data signals sent to the pixels during the sensing mode causing emission. Such artifacts may be more apparent during certain conditions, such as low ambient light and dim user interface (UI) content. Furthermore, when sensing during a scan, some pixels (e.g., green and blue pixels) may display a more apparent artifact than other pixels (e.g., red pixels). Thus, in conditions where artifacts are likely to be more apparent (e.g., low ambient light, dim UI, eye contact) pixels that are more likely to display a more apparent artifact are treated differently than pixels that are less likely to display an apparent artifact. For instance, the pixels that are less likely to display an apparent artifact may be sensed more strongly (e.g., higher sensing current) or may include sensing of more pixels per line during a scan. In some situations where artifacts are likely to be more visible, certain pixel colors that are more likely to display visible artifacts may not be sensed whatsoever. Also, a scanning scheme may vary within a single screen based on UI content. Furthermore, accounting for potential visibility of artifacts may be ignored when no eyes are detected as viewing the display. If no eyes are detected, are beyond a threshold distance from a screen, and/or are not directed at the screen, accounting for potential visibility of artifacts may be ignored. In other words, if a person is looking at the display, the person is more likely to see any artifacts caused by aggressive sensing. But if the person is not looking at the display, more aggressive sensing effectively will not produce visible artifacts since the user will not detect the artifacts.

BRIEF DESCRIPTION OF THE DRAWINGS

Various aspects of this disclosure may be better understood upon reading the following detailed description and upon reference to the drawings in which:

FIG. 13 is a diagram of display of scanning scheme for sensing during relatively high ambient light levels and/or relatively high UI luminance levels, in accordance with an embodiment;

FIG. 14 is a diagram of display of scanning scheme for sensing during relatively low ambient light levels and/or relatively low UI luminance levels, in accordance with an embodiment;

FIG. 15 is a diagram of display having a scanning scheme for a screen that includes both relatively high UI luminance levels and relatively low UI luminance levels, in accordance with an embodiment;

FIG. 16 is a flow diagram for a process for scanning a display based on video content luminosity, in accordance with an embodiment;

FIG. 17 is a flow diagram for a process for scanning a display based on ambient light levels, in accordance with an embodiment;

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As previously discussed, a sensing scan of an active area of pixels may result in artifacts detected via emissive pixels that emit light during a sensing mode scan. Such artifacts may be more apparent during certain conditions, such as low ambient light and dim user interface (UI) content. Furthermore, when sensing during a scan, some pixels (e.g., green and blue pixels) may display a more apparent artifact than other pixels (e.g., red pixels). Thus, in conditions where artifacts are likely to be more apparent (e.g., low ambient light, dim UI, eye contact) pixels that are more likely to display a more apparent artifact are treated differently than pixels that are less likely to display an apparent artifact. For instance, the pixels that are less likely to display an apparent artifact may be sensed more strongly (e.g., higher sensing current) and/or may include sensing of more pixels per line during a scan. In some situations where artifacts are likely to be more visible, certain pixel colors that are more likely to display visible artifacts may not be sensed at all. Also, a scanning scheme may vary within a single screen based on UI content varying throughout the screen. Furthermore, accounting for potential visibility of artifacts may be ignored when no eyes are detected, are beyond a threshold distance from a screen, and/or are not directed at the screen since even apparent artifacts are unlikely to be seen if a user is too far from the screen or is not looking at the screen.

Figure 1:
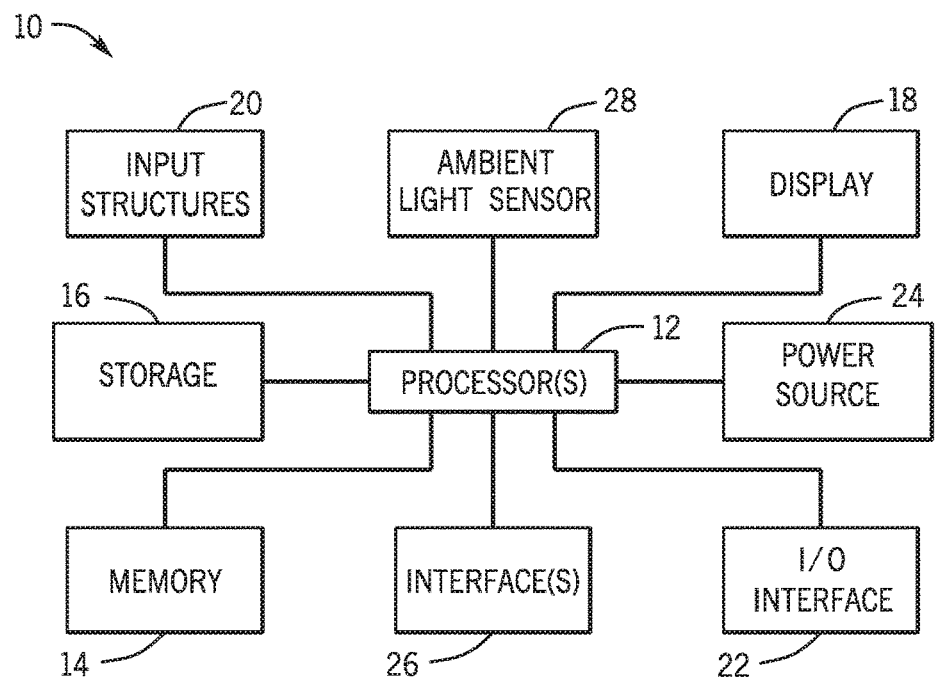
FIG. 1 is a schematic block diagram of an electronic device including a display, in accordance with an embodiment.

With the foregoing in mind and referring first to FIG. 1, an electronic device 10 according to an embodiment of the present disclosure may include, among other things, one or more processor(s) 12, memory 14, nonvolatile storage 16, a display 18, input structures 20, an input/output (I/O) interface 22, a power source 24, and an interface(s) 26. The various functional blocks shown in FIG. 1 may include hardware elements (e.g., including circuitry), software elements (e.g., including computer code stored on a computer-readable medium) or a combination of both hardware and software elements. It should be noted that FIG. 1 is merely one example of a particular implementation and is intended to illustrate the types of components that may be present in electronic device 10.

In the electronic device 10 of FIG. 1, the processor(s) 12 and/or other data processing circuitry may be operably coupled with the memory 14 and the nonvolatile storage 16 to perform various algorithms. Such programs or instructions, including those for executing the techniques described herein, executed by the processor(s) 12 may be stored in any suitable article of manufacture that includes one or more tangible, computer-readable media at least collectively storing the instructions or routines, such as the memory 14 and the nonvolatile storage 16. The memory 14 and the nonvolatile storage 16 may include any suitable articles of manufacture for storing data and executable instructions, such as random-access memory, read-only memory, rewritable flash memory, hard drives, and/or optical discs. Also, programs (e.g., an operating system) encoded on such a computer program product may also include instructions that may be executed by the processor(s) 12 to enable the electronic device 10 to provide various functionalities.

In certain embodiments, the display 18 may be a liquid crystal display (e.g., LCD), which may allow users to view images generated on the electronic device 10. In some embodiments, the display 18 may include a touch screen, which may allow users to interact with a user interface of the electronic device 10. Furthermore, it should be appreciated that, in some embodiments, the display 18 may include one or more light emitting diode (e.g., LED) displays, or some combination of LCD panels and LED panels.

The input structures 20 of the electronic device 10 may enable a user to interact with the electronic device 10 (e.g., pressing a button to increase or decrease a volume level, a camera to record video or capture images). The I/O interface 22 may enable electronic device 10 to interface with various other electronic devices. The I/O interface 22 may include various types of ports that may be connected to cabling. These ports may include standardized and/or proprietary ports, such as USB, RS232, Apple's Lightning® connector, as well as one or more ports for a conducted RF link.

As further illustrated, the electronic device 10 may include a power source 24. The power source 24 may include any suitable source of power, such as a rechargeable lithium polymer (e.g., Li-poly) battery and/or an alternating current (e.g., AC) power converter. The power source 24 may be removable, such as a replaceable battery cell.

The interface(s) 26 enable the electronic device 10 to connect to one or more network types. The interface(s) 26 may also include, for example, interfaces for a personal area network (e.g., PAN), such as a Bluetooth network, for a local area network (e.g., LAN) or wireless local area network (e.g., WLAN), such as an 802.11x Wi-Fi network or an 802.15.4 network, and/or for a wide area network (e.g., WAN), such as a 3rd generation (e.g., 3G) cellular network, 4th generation (e.g., 4G) cellular network, or long term evolution (e.g., LTE) cellular network. The interface(s) 26 may also include interfaces for, for example, broadband fixed wireless access networks (e.g., WiMAX), mobile broadband Wireless networks (e.g., mobile WiMAX), and so forth.

The electronic device 10 may also include an ambient light sensor 28 to detect an ambient light level around the electronic device 10. In some embodiments, the ambient light sensor 28 may be a separate stand-alone sensor. Additionally or alternatively, the ambient light sensor 28 may be embodied as a function of a camera of the electronic device 10.

Figure 2:
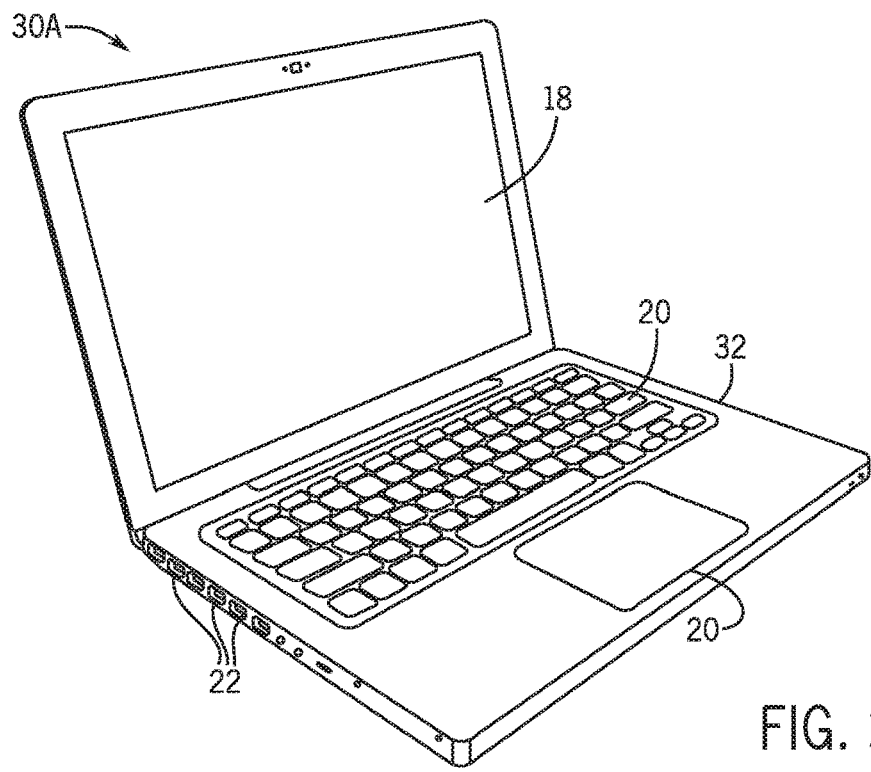
FIG. 2 is a perspective view of a notebook computer representing an embodiment of the electronic device of FIG. 1, in accordance with an embodiment.
Figure 4:
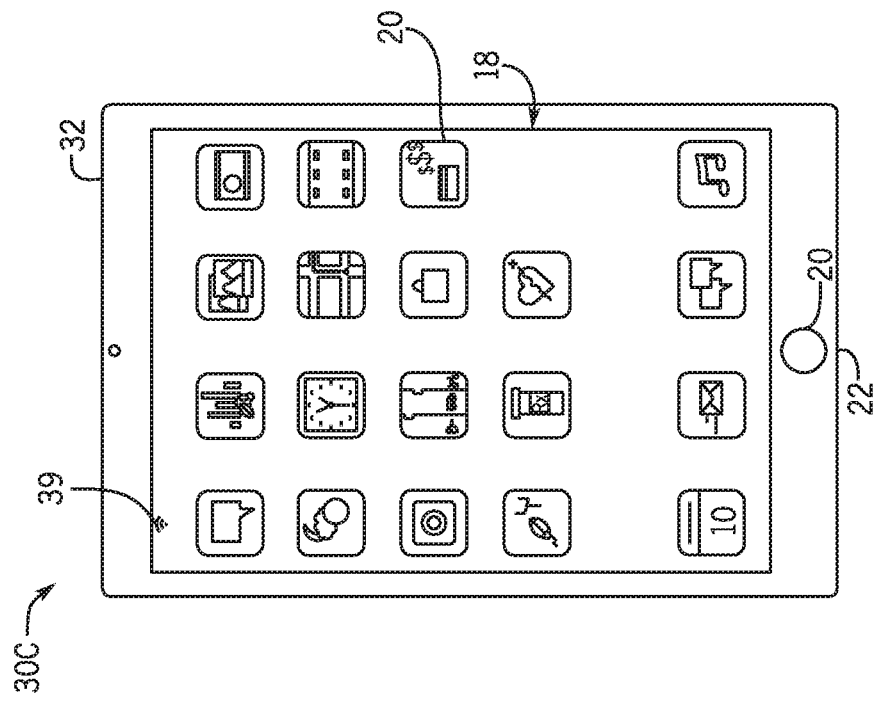
FIG. 4 is a front view of another hand-held device representing another embodiment of the electronic device of FIG. 1, in accordance with an embodiment.
Figure 3:
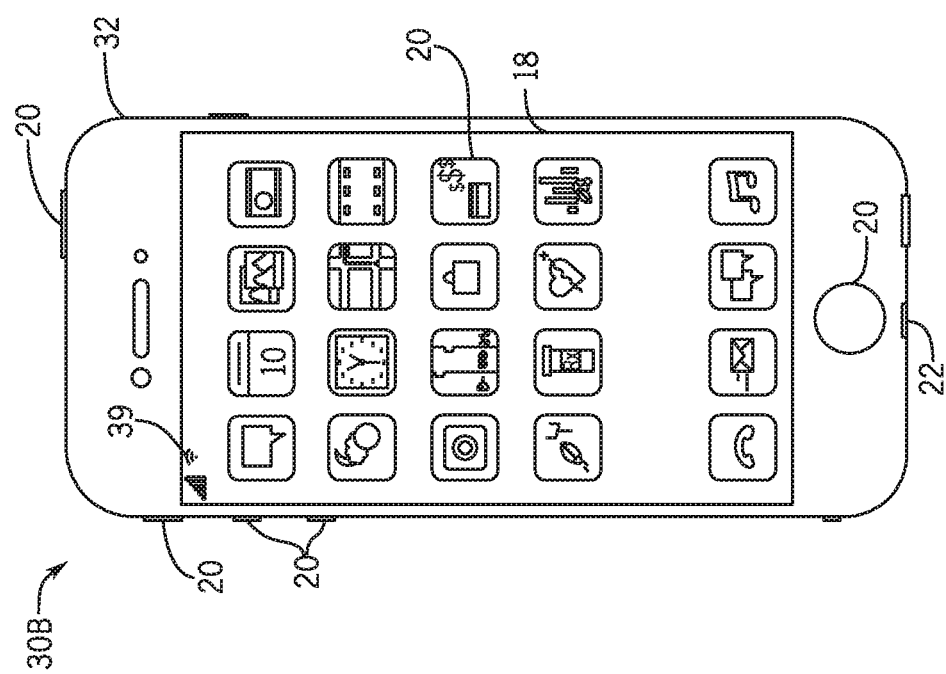
FIG. 3 is a front view of a hand-held device representing another embodiment of the electronic device of FIG. 1, in accordance with an embodiment.
Figure 5:
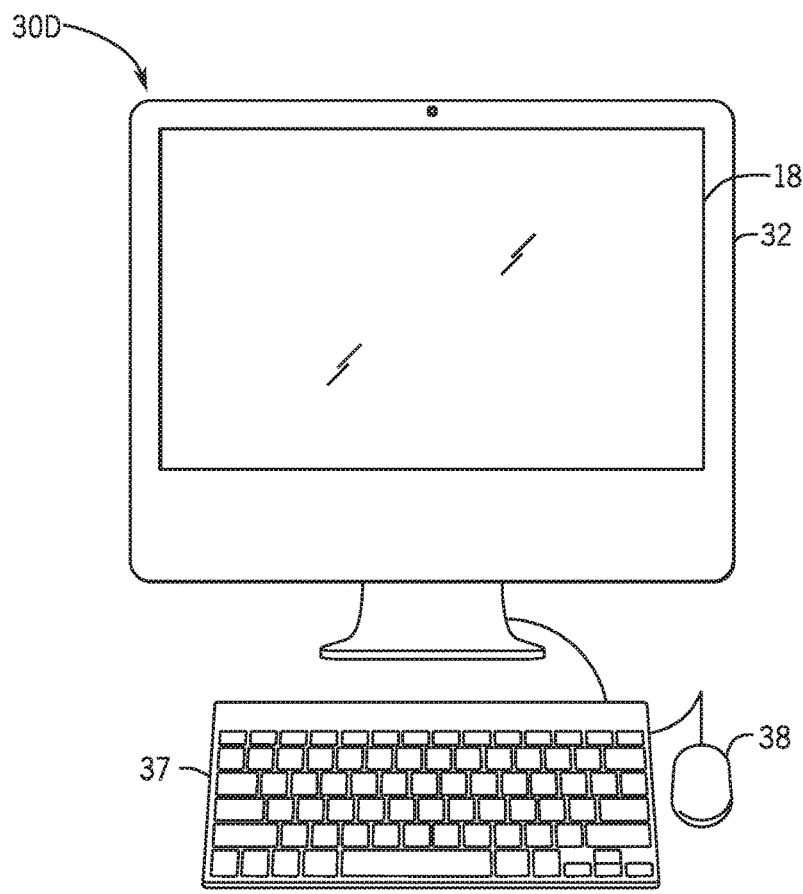
FIG. 5 is a front view of a desktop computer representing another embodiment of the electronic device of FIG. 1, in accordance with an embodiment.
Figure 6:
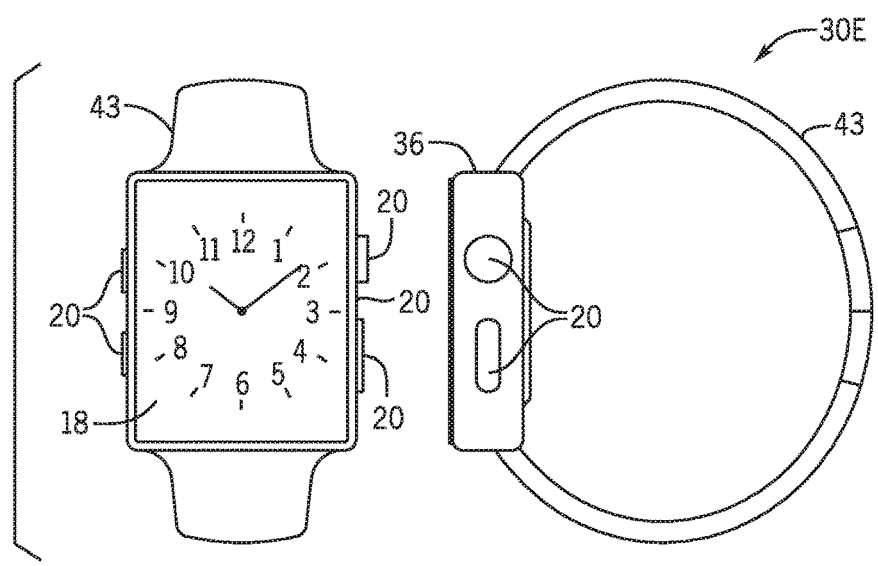
FIG. 6 is a front view of a wearable electronic device representing another embodiment of the electronic device of FIG. 1, in accordance with an embodiment.

By way of example, the electronic device 10 may represent a block diagram of the notebook computer depicted in FIG. 2, the handheld device depicted in either of FIG. 3 or FIG. 4, the desktop computer depicted in FIG. 5, the wearable electronic device depicted in FIG. 6, or similar devices. It should be noted that the processor(s) 12 and/or other data processing circuitry may be generally referred to herein as "data processing circuitry." Such data processing circuitry may be embodied wholly or in part as software, firmware, hardware, or any combination thereof. Furthermore, the data processing circuitry may be a single contained processing module or may be incorporated wholly or partially within any of the other elements within the electronic device 10.

In certain embodiments, the electronic device 10 may take the form of a computer, a portable electronic device, a wearable electronic device, or other type of electronic device. Such computers may include computers that are generally portable (e.g., such as laptop, notebook, and tablet computers) as well as computers that are generally used in one place (e.g., such as conventional desktop computers, workstations and/or servers). In certain embodiments, the electronic device 10 in the form of a computer may be a model of a MacBook®, MacBook® Pro, MacBook Air®, iMac®, Mac® mini, or Mac Pro® available from Apple Inc. By way of example, the electronic device 10, taking the form of a notebook computer 30A, is illustrated in FIG. 2 in accordance with one embodiment of the present disclosure. The depicted computer 30A may include a housing or enclosure 32, a display 18, input structures 20, and ports of the I/O interface 22. In one embodiment, the input structures 20 (e.g., such as a keyboard and/or touchpad) may be used to interact with the computer 30A, such as to start, control, or operate a GUI or applications running on computer 30A. For example, a keyboard and/or touchpad may allow a user to navigate a user interface or application interface displayed on display 18.

FIG. 3 depicts a front view of a handheld device 30B, which represents one embodiment of the electronic device 10. The handheld device 30B may represent, for example, a portable phone, a media player, a personal data organizer, a handheld game platform, or any combination of such devices. By way of example, the handheld device 30B may be a model of an iPod® or iPhone® available from Apple Inc. of Cupertino, Calif.

The handheld device 30B may include an enclosure 32 to protect interior components from physical damage and to shield them from electromagnetic interference. The enclosure 32 may surround the display 18, which may display indicator icons 39. The indicator icons 39 may indicate, among other things, a cellular signal strength, Bluetooth connection, and/or battery life. The I/O interfaces 22 may open through the enclosure 32 and may include, for example, an I/O port for a hard wired connection for charging and/or content manipulation using a connector and protocol, such as the Lightning connector provided by Apple Inc., a universal serial bus (e.g., USB), one or more conducted RF connectors, or other connectors and protocols.

The illustrated embodiments of the input structures 20, in combination with the display 18, may allow a user to control the handheld device 30B. For example, a first input structure 20 may activate or deactivate the handheld device 30B, one of the input structures 20 may navigate user interface to a home screen, a user-configurable application screen, and/or activate a voice-recognition feature of the handheld device 30B, while other of the input structures 20 may provide volume control, or may toggle between vibrate and ring modes. Additional input structures 20 may also include a microphone that may obtain a user's voice for various voice-related features, and a speaker to allow for audio playback and/or certain phone capabilities. The input structures 20 may also include a headphone input (not illustrated) to provide a connection to external speakers and/or headphones and/or other output structures.

FIG. 4 depicts a front view of another handheld device 30C, which represents another embodiment of the electronic device 10. The handheld device 30C may represent, for example, a tablet computer, or one of various portable computing devices. By way of example, the handheld device 30C may be a tablet-sized embodiment of the electronic device 10, which may be, for example, a model of an iPad® available from Apple Inc. of Cupertino, Calif.

Turning to FIG. 5, a computer 30D may represent another embodiment of the electronic device 10 of FIG. 1. The computer 30D may be any computer, such as a desktop computer, a server, or a notebook computer, but may also be a standalone media player or video gaming machine. By way of example, the computer 30D may be an iMac®, a MacBook®, or other similar device by Apple Inc. It should be noted that the computer 30D may also represent a personal computer (e.g., PC) by another manufacturer. A similar enclosure 32 may be provided to protect and enclose internal components of the computer 30D such as the dual-layer display 18. In certain embodiments, a user of the computer 30D may interact with the computer 30D using various peripheral input devices, such as the keyboard 37 or mouse 38, which may connect to the computer 30D via an I/O interface 22.

Similarly, FIG. 6 depicts a wearable electronic device 30E representing another embodiment of the electronic device 10 of FIG. 1 that may be configured to operate using the techniques described herein. By way of example, the wearable electronic device 30E, which may include a wristband 43, may be an Apple Watch® by Apple, Inc. However, in other embodiments, the wearable electronic device 30E may include any wearable electronic device such as, for example, a wearable exercise monitoring device (e.g., pedometer, accelerometer, heart rate monitor), or other device by another manufacturer. The display 18 of the wearable electronic device 30E may include a touch screen (e.g., LCD, an organic light emitting diode display, an active-matrix organic light emitting diode (e.g., AMOLED) display, and so forth), which may allow users to interact with a user interface of the wearable electronic device 30E.

Figure 7:
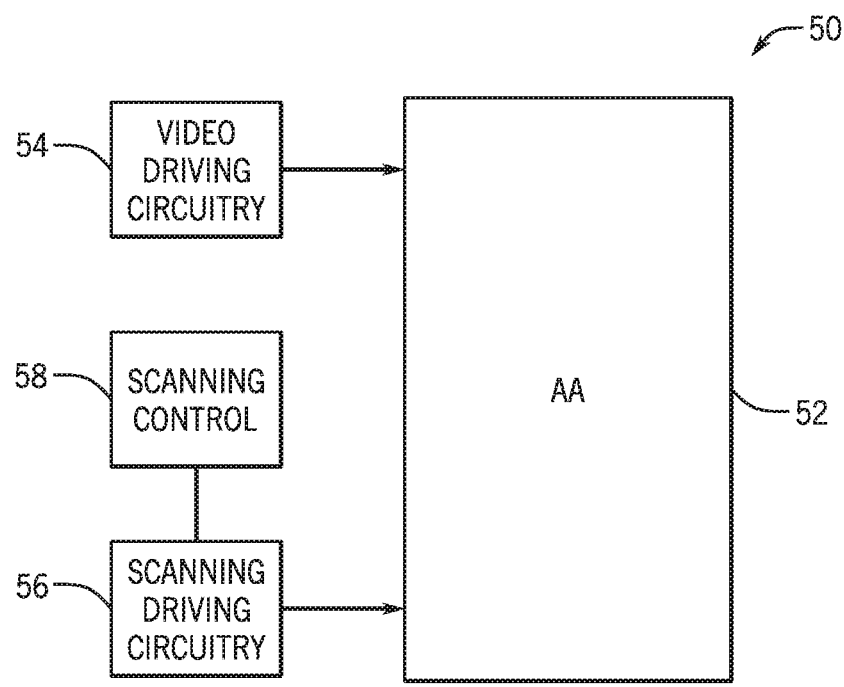
FIG. 7 is a schematic view of a display system that includes an active area and driving circuitry for display and sensing modes, in accordance with an embodiment.
Figure 8:
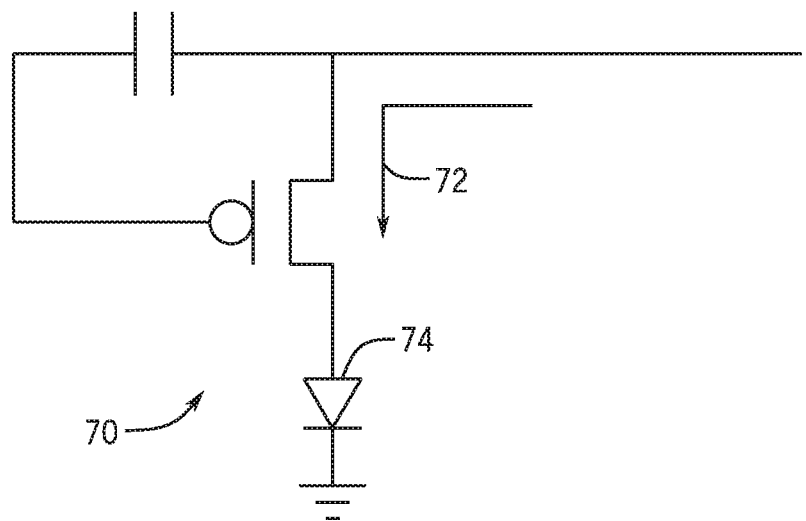
FIG. 8 is a schematic view of a pixel circuitry of the active area of FIG. 7, in accordance with an embodiment.
Figure 9:
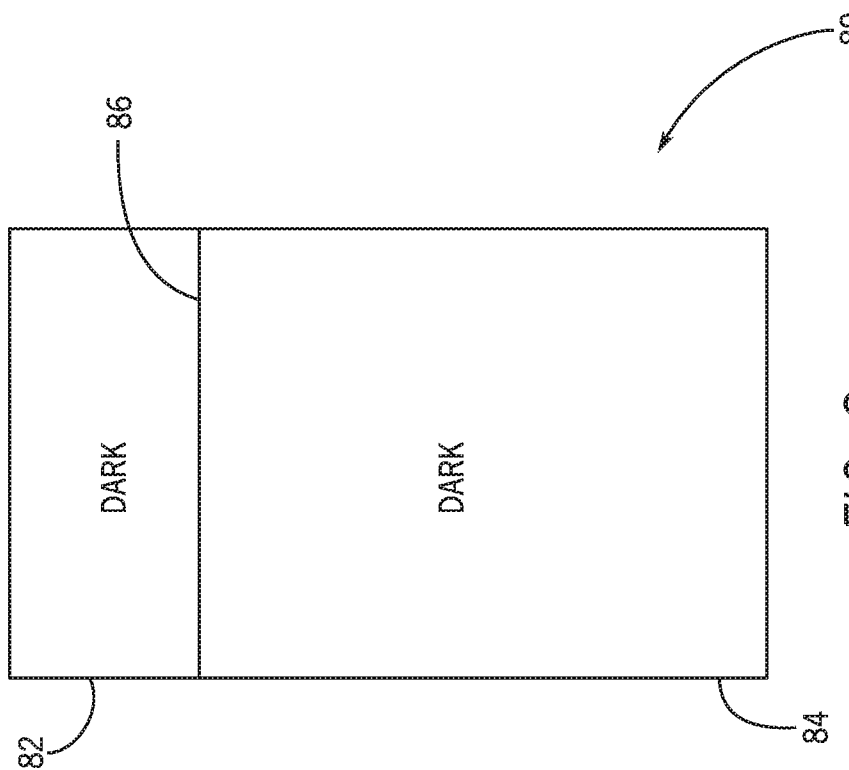
FIG. 9 is a diagram of display artifact resulting from a scan of a line with a dark display, in accordance with an embodiment.

FIG. 7 illustrates a display system 50 that may be included in the display 18 be used to display and scan an active area 52 of the display 18. The display system 50 includes video driving circuitry 54 that drives circuitry in the active area 52 to display images. The display system 50 also includes scanning driving circuitry 56 that drives circuitry in the active area 52. In some embodiments, at least some of the components of the video driving circuitry 54 may be common to the scanning driving circuitry 56. Furthermore, some circuitry of the active area may be used both for displaying images and scanning. For example, pixel circuitry 70 of FIG. 8 may be driven, alternatingly, by the video driving circuitry 54 and the scanning driving circuitry 56. When a pixel current 72 is submitted to a light emitting diode (LED) 74 from the video driving circuitry 54 and the scanning driving circuitry 56, the LED 74 turns on. However, emission of the LED 74 during a scanning phase may result in artifacts. For example, FIG. 9 illustrates a screen 80 that is supposed to be dark during a scanning phase. However, during the scanning phase, the screen 80 may be divided into an upper dark section 82 and a lower dark section 84 by a line artifact 86 that is due to scanning pixels in a line during the scanning phase causing activation of pixels in the line. The visibility of the line artifact may vary based on various parameters for the scanning the display 18.

Figure 10:
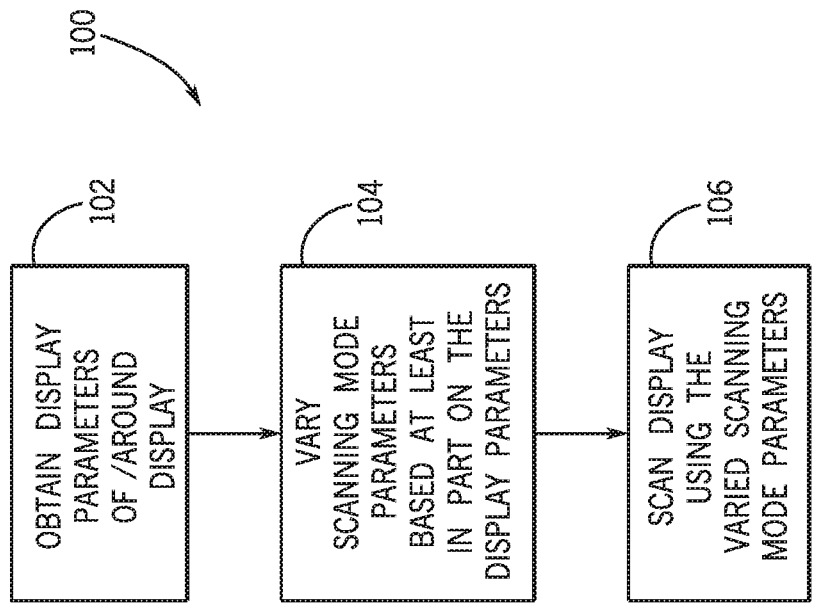
FIG. 10 is a flow diagram of a process for scanning a display to sense information about the display, in accordance with an embodiment.

To reduce visibility of scans during the scanning mode, scanning controller 58 of FIG. 7 may control scanning mode parameters used to drive the scanning mode via the scanning driving circuitry 56. The scanning controller 58 may be embodied using software, hardware, or a combination thereof. For example, the scanning controller 58 may at least be partially embodied as the processors 12 using instructions stored in memory 14. FIG. 10 illustrates a process 100 that may be employed by the scanning controller 58. The scanning controller 58 obtains display parameters of or around the display 12/electronic device 10 (block 102). For example, the display parameters may include image data including pixel luminance (total luminance or by location), ambient light, image colors, temperature map of the screen 80, power remaining in the power source 24, and/or other parameters. Based at least in part on these parameters, the scanning controller 58 varies scanning mode parameters of the scanning mode (block 104). For example, the scanning controller 58 may vary the scanning frequency, scanning mode whether pixels of different colors are scanned simultaneously in a single pixel and/or in the same line, scanning location and corresponding scanning mode of pixels by location, and/or other parameters of scanning. Using the varied scanning mode parameters, the scanning controller 58 scans the active area 52 of the display 12 (block 106).

Figure 11:
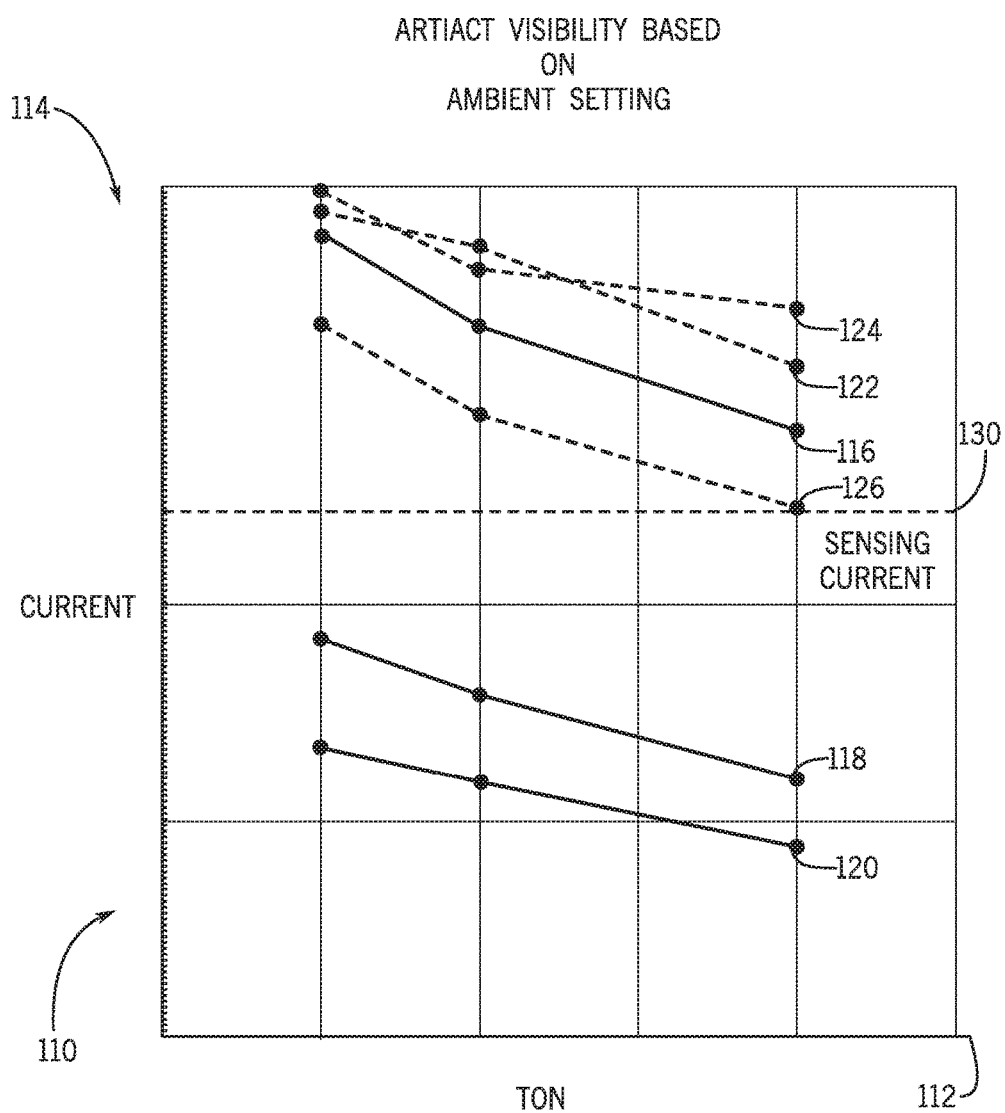
FIG. 11 is a graph of visibility of various colors of pixels during a sense based on ambient light levels, in accordance with an embodiment.

As an illustration of a change in visibility of a scanning mode, FIG. 11 illustrates maximum current that is substantially undetectable of a scanning mode relative to a color, an ambient light level, and a period of time that each LED emits. FIG. 11 includes a graph 110 that includes a horizontal axis 112 corresponding to a period of emission and a vertical axis 114 corresponding to a current level to control luminance of the respective LED. Furthermore, the graph 110 illustrates a difference in visibility due to changes in ambient light level.

Lines 116, 118, and 120 respectively correspond to detectable level of emission of red, blue, and green LEDs at a first level (e.g., 0 lux) of luminance of ambient light. Lines 122, 124, and 126 respectively correspond to visible emission of red, blue, and green LEDs at a second and higher level (e.g., 20 lux) of luminance of ambient light. As illustrated, red light is visible at a relatively similar current at both light levels. However, blue and green light visible at substantially lower current at the lower ambient light level. Furthermore, a sensing current 130 may be substantially above a maximum current at which the blue and green lights are visible at the lower level. Thus, red sensing may be on for temperature sensing and red pixel aging sensing regardless of ambient light level without risking detectability. However, blue and green light may be detectable at low ambient light if tested. Thus, the scanning controller 58 may disable blue and green sensing unless ambient light levels is above an ambient light threshold. Additionally or alternatively, a sensing strength (e.g., current, pixel density, duration, etc.) may be set based at least in part on ambient light.

Figure 12:
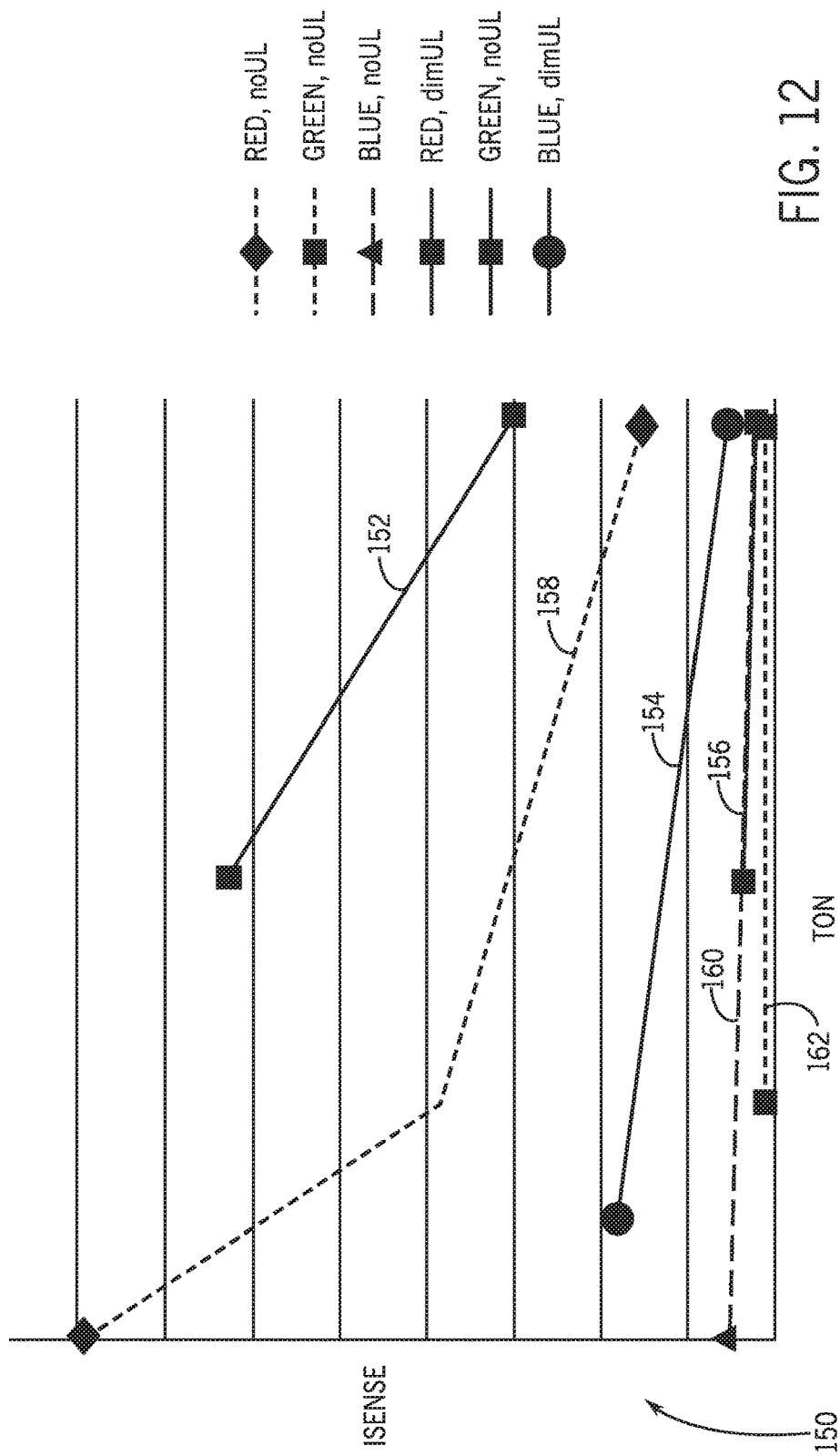
FIG. 12 is a graph of visibility of various colors of pixels during a sense based on luminance of the display, in accordance with an embodiment.

FIG. 12 illustrates a graph 150 reflecting permissibility of a sensing current before risking detectability of a scan/sense relative to a brightness level of the screen of the active area 52. Lines 152, 154, and 156 respectively correspond to an edge of a detectable level of emission of red, blue, and green LEDs at a first level of luminance (e.g., no user interface or dark screen) of the screen of the active area 52. Lines 158, 160, and 162 respectively correspond to an edge of a visible emission of red, blue, and green LEDs at a second and higher level of luminance (e.g., low luminance user interface) of the screen of the active area 52. As illustrated, red light is only visible at a relatively high current at both luminance levels. However, blue light and green light are both visible at substantially lower current at the both luminance levels. Based on the foregoing, red sensing may be on for temperature sensing, touch sensing, and red pixel aging sensing regardless of UI level without risking detectability. However, blue and green light may be detectable at dim UI levels, if tested. Thus, the scanning controller 58 may disable blue and green sensing unless UI luminance levels are above a UI light threshold or operate blue or green sensing with lower sensing levels or by skipping more pixels in a line during a sense/scan.

FIGS. 13-15 illustrate potential scanning schemes relative to parameters of the electronic device 10 and/or around the electronic device 10. The parameters may include ambient light levels, brightness of a user interface (UI), or other parameters. For example, the electronic device 10 may employ a first scanning scheme 200 where all pixels in a line (e.g., lines 202, 204, and 206) may be scanned in each scanning phase. This scheme may be deployed when relatively high ambient light is located around the electronic device 10 and/or when the display has bright luminance (e.g., bright UI). Furthermore, when using the scanning scheme 200, the electronic device 10 may employ a relatively high sensing level (e.g., higher sensing current) of each of the lines rather than a relatively low sensing level that may be used with low ambient light and/or low brightness UIs.

Moreover, in some embodiments, the lines 202, 204, and 206 may correspond to different color pixels being scanned. For example, the line 202 may correspond to a scan of red pixels, the line 204 may correspond to a scan of green pixels, and the line 206 may correspond to a scan of blue pixels. Furthermore, these different colors may be scanned using a similar scanning level or may deploy a scanning level that is based at least in part on visibility of the scan based on scanned color of pixel. For example, the line 202 may be scanned at a relatively high level with the line 204 scanned at a level near the same level. However, the line 206 may be scanned at a relatively lower level (e.g., lower sensing current) during the scan. Alternatively, in the high ambient light and/or bright UI conditions, all scans may be driven using a common level regardless of color being used to sense.

FIG. 14 illustrates a scanning scheme 210 that may be deployed when conditions differ from those used to display the scheme 200. For example, the scheme 210 may be used when ambient light levels and/or UI brightness levels are low. The scheme 200 includes varying how many pixels in a line are scanned in each pass. For instance, the lines 212, 214, and 216 may skip at least one pixel in the line when scanning a line for sensing. In some embodiments, an amount of pixels skipped in a scanning may depend on the color being used to scan the line, a sensing level of the scan, the ambient light level, UI brightness, and/or other factors. Additionally or alternatively, a sensing level may be adjusted inversely with the number of pixels skipped in the line.

The number of pixels skipped in a line may not be consistent between at least some of the scanned lines 212, 214, and 216. For example, more pixels may be skipped for colors (e.g., blue and green) that are more susceptible to being visible during a scan during low ambient light scans and/or dim UI scans. Additionally or alternatively, a sensing level may be inconsistent between at least some of the scanned lines 212, 214, and 216. For example, the line 212 may be scanned at a higher level (e.g., greater sensing current) than the lines 214 and 216 as reflected by the varying thickness of the lines in FIG. 14. In this example, the line 212 corresponds to a color (e.g., red) that is less susceptible to visibility during a scan than the colors (e.g., blue and green) of the lines 214 and 216. In some embodiments, the electronic device 10 may skip all pixels for more visible colors (e.g., blue and/or green) effectively reducing sensing level to zero (e.g., sensing current of 0 amps) for such colors.

As previously discussed, scanning of a screen may be varied as a function of UI brightness. However, this variation may also occur spatially throughout the UI. In other words, the scan may vary through various regions of content within a single screen. FIG. 15 illustrates a screen 220 that includes a brighter UI content region 222 surrounded by darker UI content regions 224 and 226. Scans of pixels in the brighter UI content region 222 may reflect the scheme 200 in FIG. 13. Specifically, the lines 228, 230, and 232 may correspond to the lines 202, 204, and 206, respectively.

In the darker UI regions 224 and 226, scanning may be treated differently. For example, lines 234, 236, and 238 may be treated similar to the lines 212, 214, and 216 of FIG. 14, respectively. Moreover, colors corresponding to more visible colors (e.g., blue and green) may be omitted entirely from scans of pixels in the darker UI regions 224 and 226.

FIG. 16 illustrates a process 250 for selecting a scanning scheme for a display 18 of an electronic device 10 based at least in part on luminance of UI content. A processors 12 of the electronic device 10 receives a brightness value of content to be displayed on the display 18 (block 252). In some embodiments, the processors 12 may derive the brightness from video content by deriving luminance values from the video content. The processors 12 determine if the brightness value is above a threshold value (block 254). If the threshold is above a threshold value, the processors 12 uses a first scanning scheme to scan pixels of the display (block 256). The first scanning scheme may include scanning all colors at a same level or scanning at least a portion of colors at a reduced level. If the threshold is below the threshold value, the processors 12 uses a second scanning scheme to scan pixels of the display (block 258). If the first scanning scheme includes scanning all colors at a same level, the second scanning scheme includes using a first scanning level and/or frequency for a first color (e.g., red) and using a lower scanning level and/or lower scanning frequency for at least one other color (e.g., green and/or blue). If the first scanning scheme includes scanning at least a portion of colors at a reduced level, the second scanning scheme includes foregoing scanning of the portion of colors.

FIG. 17 illustrates a process 260 for selecting a scanning scheme for a display 18 of an electronic device 10 based at least in part on ambient light levels. A processors 12 of the electronic device 10 receives an ambient light level (block 262). In some embodiments, the processors 12 may receive the ambient light level from an ambient light sensor of the electronic device 10. The processors 12 determine if the ambient light level value is above a threshold value (block 264). If the threshold is above a threshold value, the processors 12 uses a first scanning scheme to scan pixels of the display (block 266). The first scanning scheme may include scanning all colors at a same level or scanning at least a portion of colors at a reduced level. If the threshold is below the threshold value, the processors 12 uses a second scanning scheme to scan pixels of the display (block 268). If the first scanning scheme includes scanning all colors at a same level, the second scanning scheme includes using a first scanning level and/or frequency for a first color (e.g., red) and using a lower scanning level and/or lower scanning frequency for at least one other color (e.g., green and/or blue). If the first scanning scheme includes scanning at least a portion of colors at a reduced level, the second scanning scheme includes foregoing scanning of the portion of colors. Furthermore, the scan scheme may vary by region within a display, as previously discussed regarding FIG. 15.

The processes 250 and 260 may be used in series to each other, such that the scanning scheme derived from a first process (e.g., process 250 or 260) may be then further modified by a second process (e.g., process 260 or 250). In some embodiments, some of the scanning schemes may be common to each process. For example, the processes may include a full scan scheme using all colors at same level and frequency, a reduced level or frequency for some colors, and a scheme omitting scans of at least one color. Furthermore, in some embodiments, one process may be applied to select whether to reduce a number of pixels scanned in a row while a different process may be applied to select levels at which pixels are to be scanned.

Figure 18:
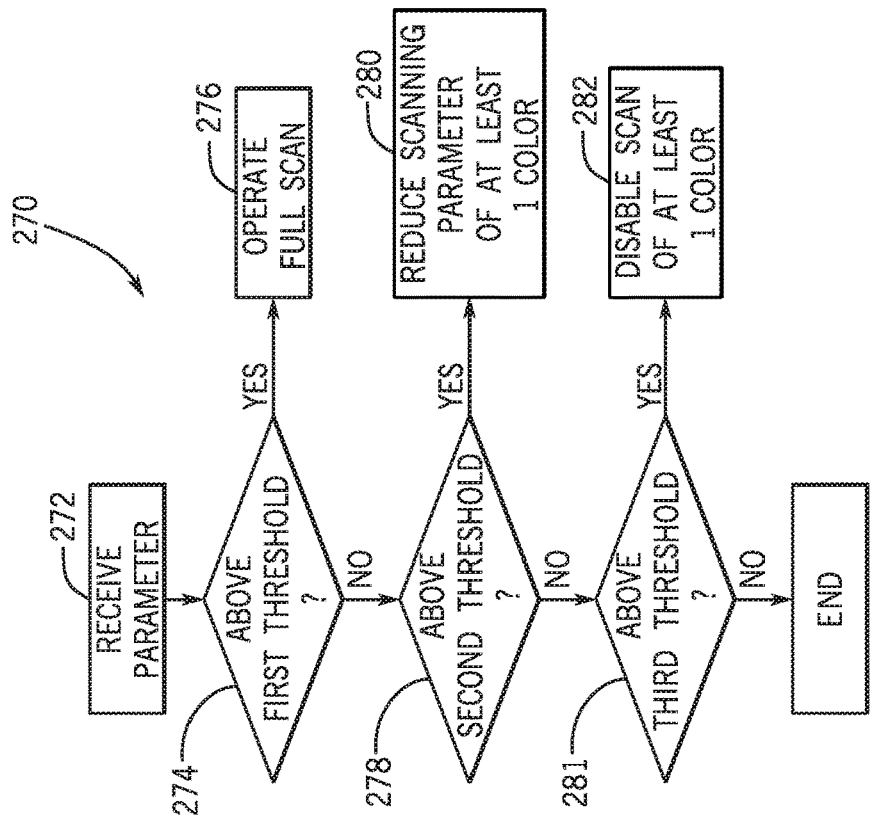
FIG. 18 is a flow diagram for a process for scanning a display for sensing based on a parameter using two thresholds, in accordance with an embodiment.

Furthermore, each process previously discussed may include more than a single threshold. FIG. 18 illustrates a process 270 that includes multiple thresholds. The processors 12 receive a parameter, such as ambient light levels, UI brightness, eye locations, and/or other factors around the electronic device 10 (block 272). The processors 12 determine whether the parameter is above a first threshold (block 274). If the parameter is above the first threshold, a full scan mode is used (block 276). A full scan may include using pixels of all colors at a common level. If the parameter is not above the first threshold, the processors 12 determine whether the parameter is above a second threshold (block 278). If the parameter is above the second threshold, the processors 12 cause a scan of the display using a reduced scanning parameter of at least one color for at least corresponding portion of the display (block 280). For example, the scanning scheme for a reduced scanning parameter may include a decreased frequency and/or sensing level from the frequency and/or sensing level used for the full scan. If the parameter is above the third threshold (block 281), the processors 12 disable scanning of the at least one color for the relative portions of the screen (block 282).

Figure 19:
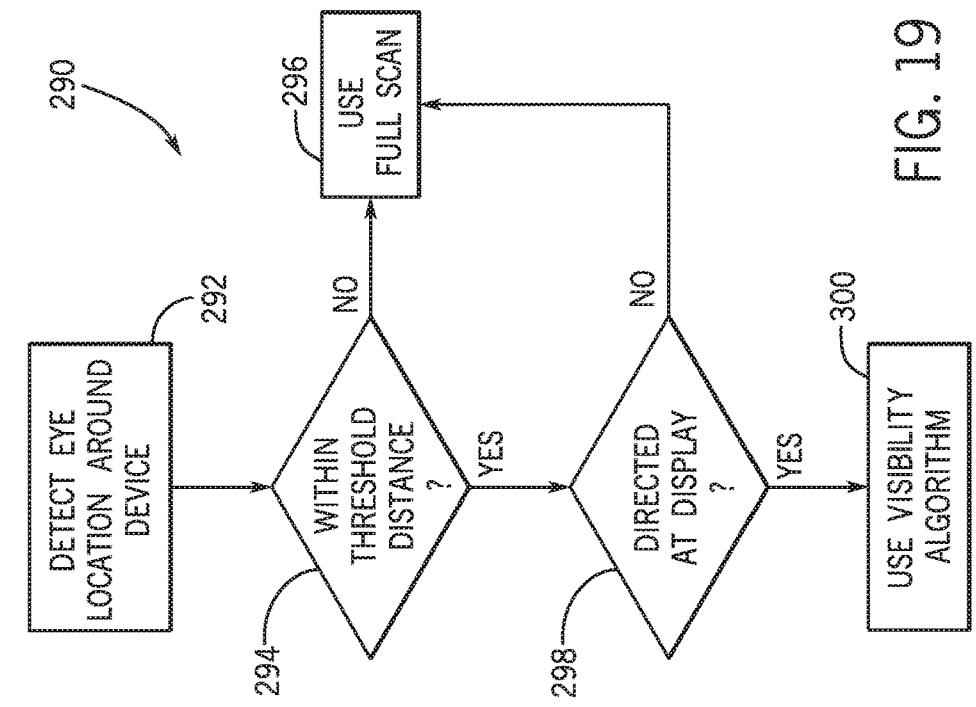
FIG. 19 is a flow diagram for a process for controlling scanning of a display for sensing based at least in part on eye locations, in accordance with an embodiment.

Visibility of a scan may be dependent upon ambient light levels and/or UI content when eyes are viewing the display. However, if no eyes are viewing the display 18, a scan may not be visible regardless of levels, frequency, or colors used to scan. Thus, the processors 12 may use eye detection to determine whether visibility reduction should be deployed. Eye tracking may be implemented using the camera of the electronic device and software running on the processors. Additionally or alternatively, any suitable eye tracking techniques and/or systems may be used to implement such eye tracking, such as eye tracking solutions provided by iMotions, Inc. of Boston, Mass. FIG. 19 illustrates a process 290 for determining whether to reduce visibility of a scan for a display 18. The processors 12 determine eye location around a device (block 292). For example, the location may be indicative of a distance from the display 18 and/or an orientation (e.g., direction of gaze) of the eyes. The processors 12 may determine such eye locations using a camera of the electronic device 10. The processors 12 determine whether the location is within a threshold distance of the display 18 (block 294). If the eye location is outside a threshold distance, the processors 12 use a full scan to scan the display 18 (block 296). Furthermore, if no eyes are detected, the location may be assumed to be greater than the threshold distance. If the eye location is within the threshold distance, the processors 12 determine whether a direction of gaze of the eyes is directed at the display 18. If the direction is oriented toward the display, the processors 12 may scan the display 18 using a visibility algorithm (block 300). The visibility algorithm may pertain to or include the processes 250 and/or 260.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. An electronic device comprising:
   a display including one or more pixels configured to:
   display images during a display mode; and
   provide information in response to a sense mode;
   a memory storing instructions; and
   a processor configured to execute the instructions, wherein the instructions are configured to cause the processor to:
   receive a parameter pertaining to operation of the display or pertaining to conditions around the electronic device, wherein the parameter comprises luminance of user interface content including relatively darker content, relatively lighter content, or a combination thereof;
   determine whether the parameter exceeds a threshold value for the parameter;
   cause a scan of the display using a first scanning scheme during the sense mode when the parameter exceeds the threshold value; and
   cause a scan of the display using a second scanning scheme during the sense mode when the parameter does not exceed the threshold value.

2. The electronic device of claim 1, wherein the parameter comprises an ambient light level.

3. The electronic device of claim 2, comprising an ambient light sensor to detect the ambient light level.

4. The electronic device of claim 1, wherein the instructions are configured to cause the processor to scan pixels corresponding to the relatively lighter content using the first scanning scheme.

5. The electronic device of claim 1, wherein the instructions are configured to cause the processor to scan pixels corresponding to the relatively darker content using the second scanning scheme.

6. A tangible, non-transitory, machine-readable storage medium storing one or more programs that are executable by one or more processors of an electronic device with a display, the one or more programs including instructions to:
   receive one or more parameters corresponding to visibility of a sense mode of the display, wherein the one or more parameters comprise ambient light levels, video content luminance levels, location of one or more eyes, or any combination thereof, and the instructions are configured to cause the one or more processors to track the location of one or more eyes using a camera;
   set one or more scanning mode parameters used for sensing based at least in part on the received one or more parameters to enable more aggressive scanning when the one or more parameters indicate a low visibility of the sense mode of the display, wherein setting one or more scanning mode parameters comprises:
   determining whether a closest location of the one or more eyes is greater than a threshold distance away from the display;
   utilizing a first set of scanning mode parameters when the closest location is greater than a threshold distance threshold away from the display; and
   utilizing a second set of scanning mode parameters when the closest location is not greater than the threshold distance threshold away from the display, wherein the second set of scanning mode parameters are more likely to result in apparent artifacts than the first set of scanning mode parameters; and
   scan the display using the scanning mode parameters.

7. The tangible, non-transitory, machine-readable storage medium of claim 6, wherein setting one or more scanning mode parameters comprises:
   determining whether a closest location of the one or more eyes is greater than a threshold distance away from the display;
   determining whether any of the one or more eyes are directed at the display;
   utilizing a first set of scanning mode parameters when the closest location is greater than a threshold distance threshold away from the display;
   utilizing a second set of scanning mode parameters when the closest location is not greater than the threshold distance threshold away from the display and any of the one or more eyes within the threshold distance are directed at the display, wherein the second set of scanning mode parameters are more likely to result in apparent artifacts than the first set of scanning mode parameters; and
   utilizing the first set of scanning mode parameters when the closest location is not greater than a threshold distance threshold away from the display but none of the one or more eyes within the threshold distance are directed at the display.

8. A method for sensing a display, comprising:
   obtaining one or more parameters of operation of the display or conditions around the display;
   setting scanning mode parameters used for sensing based at least in part on the obtained one or more parameters, wherein setting the scanning mode parameters comprises:
   determining, for each obtained parameter of the one or more parameters, whether a value of the obtained parameter exceeds a first threshold;
   setting the scanning mode to a first scanning scheme when the value of the obtained parameter exceeds the first threshold;
   when the value of the obtained parameter does not exceed the first threshold, determining, for each obtained parameter of the one or more parameters, whether the value of the obtained parameter exceeds a second threshold; and
   setting the scanning mode to a second scanning scheme when the value of the obtained parameter exceeds the second threshold; and
   scanning the display using the scanning mode parameters during a sensing phase of the display.

9. The method of claim 8, wherein the one or more parameters comprises an ambient light level, user interface luminance, eye locations, or any combination thereof.

10. The method of claim 8, wherein the scanning mode parameters comprise a sensing current, a number of pixels per line scanned, colors of pixels that are to be scanned, or some combination thereof.

11. The method of claim 8, wherein setting the scanning mode parameters comprises: setting the scanning mode to a third scanning scheme when the value of the obtained parameter exceeds a third threshold.

12. The method of claim 11, wherein the first scanning scheme comprises scanning all colors of pixels of the display using the same scanning mode parameters.

13. The method of claim 12, wherein the second scanning scheme comprises using reduced values for one or more of the scanning mode parameters for at least one of the colors of pixels of the display.

14. The method of claim 13, wherein the at least one of the colors comprises blue or green colored pixels.

15. The method of claim 8, wherein the first scanning scheme comprises using all pixel colors and the second scanning scheme comprises using only a portion of the colors.

16. The method of claim 15, wherein the second scanning scheme utilizes, for at least one color of the pixel colors, a lower sensing level or lower number of pixels per scan than used for other colors of the pixel colors.

\* \* \* \* \*